United States Patent
Huang et al.

(10) Patent No.: US 11,323,183 B1
(45) Date of Patent: May 3, 2022

(54) ANALOG FRONT-END

(71) Applicant: Hewlett Packard Enterprise Development LP, Houston, TX (US)

(72) Inventors: Tsung Ching Huang, Milpitas, CA (US); Jinsung Youn, Milpitas, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/949,592

(22) Filed: Nov. 5, 2020

(51) Int. Cl.
| | | |
|---|---|---|
| *H04B 10/06* | (2006.01) | |
| *H04B 10/61* | (2013.01) | |
| *H03F 3/45* | (2006.01) | |
| *H04B 10/69* | (2013.01) | |
| *H03F 3/08* | (2006.01) | |
| *H04L 7/00* | (2006.01) | |

(52) U.S. Cl.
CPC ........... *H04B 10/616* (2013.01); *H03F 3/087* (2013.01); *H03F 3/45973* (2013.01); *H04B 10/6911* (2013.01); *H04L 7/0075* (2013.01)

(58) Field of Classification Search
CPC ... H04B 10/616; H04B 10/6911; H03F 3/087; H03F 3/45973; H04L 7/0075
USPC ....................................................... 398/202
See application file for complete search history.

(56) References Cited

U.S. PATENT DOCUMENTS

| | | |
|---|---|---|
| 8,238,761 B2 | 8/2012 | Liu et al. |
| 9,331,790 B2 | 5/2016 | Dorren et al. |
| 2018/0109231 A1* | 4/2018 | Kinyua ................. H03M 3/458 |
| 2019/0052236 A1* | 2/2019 | Sugimoto ............ H03G 1/0023 |
| 2020/0091881 A1* | 3/2020 | Lim ......................... H03F 3/10 |

FOREIGN PATENT DOCUMENTS

| | | |
|---|---|---|
| CN | 106533375 | 3/2017 |

OTHER PUBLICATIONS

Huang et al., "A 28Gb/s 1pJ/b Shared-Inductor Optical Receiver with 56% Chip-Area Reduction in 28nm CMOS", ISSCC 2014 / Session 8 / Optical Links and Copper PHYs / 8.4, 2014, 4 pages.

(Continued)

*Primary Examiner* — Mohammad R Sedighian
(74) *Attorney, Agent, or Firm* — Hewlett Packard Enterprise Patent Department

(57) ABSTRACT

Examples described herein relate to an analog front-end (AFE). The AFE includes a trans-impedance amplifier to receive an input current and generate a pair of the differential voltage signals based on the input current and a reference current. Further, the AFE includes a dynamic voltage slicer to receive the differential voltage signals at input terminals and supply digital voltages at output terminals. The dynamic voltage slicer includes a preamplifier to generate a pair of intermediate voltages based on the differential voltage signals sampled at a predetermined frequency. The dynamic voltage slicer also includes a voltage latch circuit coupled to the preamplifier, wherein the voltage latch circuit is to regenerate a pair of digital voltages based on the pair of the intermediate voltages. Moreover, the AFE includes a logic latch coupled to the dynamic voltage slicer to provide digital output states based on the pair of the digital voltages.

20 Claims, 5 Drawing Sheets

(56) References Cited

OTHER PUBLICATIONS

Jiang et al., "100Gb/s Ethernet Chipsets in 65nm CMOS Technology", IEEE International Solid-State Circuits Conference Digest of Technical Papers, 2013, 3 pages.

Chen, W.Z. et al.; "A 1.8-V 10-Gb/s Fully Integrated CMOS Optical Receiver Analog Front-End"; Jul. 2005; 9 pages.

Chen, W.Z. et al.; "A 90-dBΩ 10-Gb/s Optical Receiver Analog Front-End in a 0.18-µm CMOS Technology"; Mar. 2007; 8 pages.

Phang, K. et al.; "A 1V 1mW CMOS Front-End with On-chip Dynamic Gate Biasing for a 75Mb/s Optical Receiver"; Feb. 2001; 3 pages.

Sharif-Bakhtiar, A. et al.; "Low-Power CMOS Receivers for Short Reach Optical Communication"; 2017; 8 pages.

\* cited by examiner

ANALOG FRONT-END

BACKGROUND

An optical communication system generally provides communication over longer distances with higher bandwidth using smaller cable width (or diameter) in comparison to communication systems using electrical wires. In the optical communication system, a light may be modulated by a first optical device (e.g., an optical transmitter) and demodulated by a second optical device (e.g., an optical receiver).

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Figure 1:
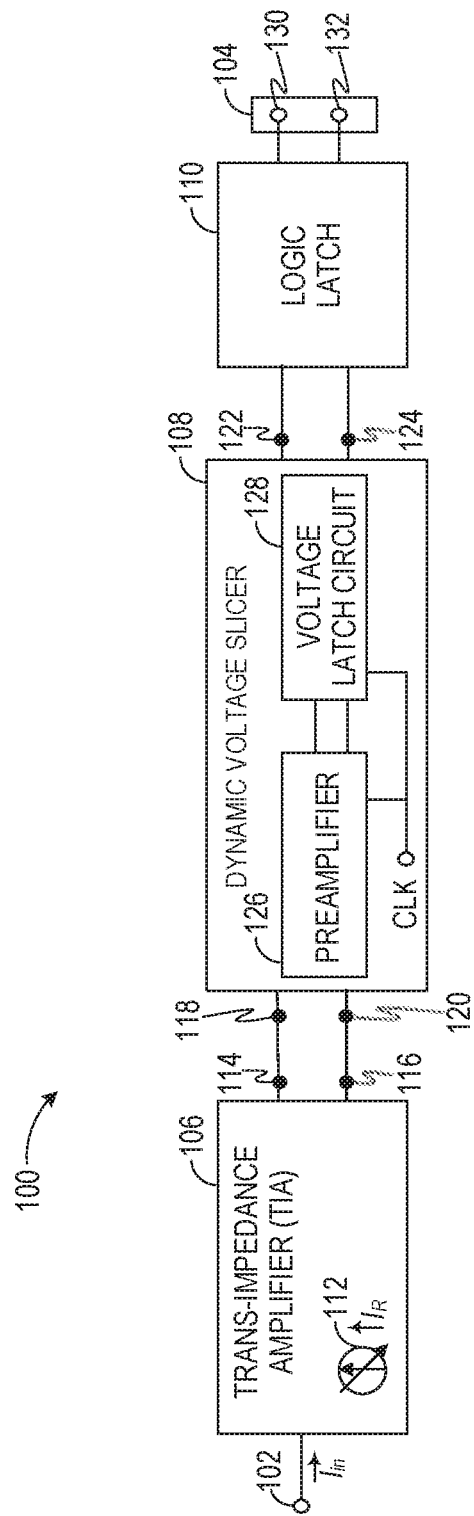
FIG. 1 depicts a block diagram of an analog front-end (AFE), in accordance with an example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, or communicatively linked through a communication channel, pathway, network, or system. Further, the term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

An optical communication system generally provides communication over longer distances with higher bandwidth using optical fibers that have compact dimensions in comparison to an electrical communication system using electrical wires. In the optical communication system, a light may be modulated and transmitted by a first optical device, which can be received and demodulated by a second optical device (e.g., an optical receiver) via an optical waveguide, for example, a fiber optic cable.

A conventional optical receiver may include a photodetector that may covert a received light into an input current, and an AFE to process the input current to generate a digital bit stream. The conventional optical receiver requires multiple stages of analog amplification circuits in its AFE including, a single-ended trans-impedance amplifier, a variable-gain amplifier (VGA); equalization circuits such as a continuous-time linear equalizer (CTLE) and/or a decision feedback equalizer (DFE); and clock and data recovery (CDR) circuits. Due to ever increasing data rates (e.g., 112 Gb/s and more) in both optical and electrical links, time-interleaved analog-to-digital converters (TI-ADC) have been implemented in the AFE that trade-off between voltage gain and bandwidth in the AFE in the conventional optical receiver. In the case of the DFE, CDR, or TI-ADC, a high-speed latch is implemented that samples and regenerates analog signals up-to about a data rate of 10 Gigabits-per-second. However, such high-speed latch consumes a considerably large amount of power to meet the performance requirements. By way of example, the one or more of the DFE or TI-ADC in the conventional optical receiver may be implemented via traditionally known current-mode logic (CML) latch and/or StrongARM latch.

Disadvantageously, while the CML latch draws large currents due to use of one or more tail current sinks, the StrongARM latch is prone to slow-speed operation as it exhibits increased output impedance and capacitive loads. In particular, each of output terminals of the StrongARM latch employed in the AFE of the conventional optical receivers generally drives (e.g., controls switching) several switches that increases the capacitive load on the output terminals of the StrongARM latch. Further, voltages at the output terminals of the StrongARM latch also discharge via several switches, thereby facing increased resistance/impedance in the discharge of the voltages at the output terminals of the StrongARM latch. Such increased capacitive load and the resistance/impedance experienced by the StrongARM latch slows-down an operating speed/bandwidth of the AFE of the conventional optical receivers.

In accordance with aspects of the present disclosure, an enhanced AFE is presented that not only consumes reduced power but also is capable of operating at high speeds in comparison to that of the conventional optical receiver. In accordance with some examples, the AFE includes a trans-impedance amplifier (TIA) to receive an input current and generate a pair of differential voltage signals based on the input current and a reference current. Further, the AFE includes a dynamic voltage slicer to receive the pair of the differential voltage signals at input terminals and supply digital voltages signals at output terminals. The dynamic voltage slicer includes a preamplifier to generate a pair of intermediate voltages based on the pair of the differential voltage signals sampled at a predetermined frequency. The dynamic voltage slicer also includes a voltage latch circuit coupled to the preamplifier, wherein the voltage latch circuit is to regenerate a pair of digital voltages based on the pair of the intermediate voltages. Moreover, the AFE includes a logic latch coupled to the dynamic voltage slicer to provide digital output states based on the pair of the digital voltages.

As will be appreciated, in accordance with some examples, the AFE of the present disclosure may generate digital output states (i.e., a bit stream of ones and zeros) for the input current of very little magnitude (e.g., of the order of microamperes) event at high frequencies. This is achieved at least partially based on various technical enhancements captured in the AFE of the present disclosure. For example, in comparison to trans-impedance amplifiers used in the AFE of conventional optical receivers that typically produce a single-ended output, the TIA implemented in the AFE of the present disclosure produces differential voltages. In particular, the use of the differential voltages generated by the TIA enhances decision making by the dynamic voltage slicer that aids in generating clearly distinguishable digital voltages (e.g., at supply voltage and ground potential). Further, while the CML latches used in the AFE of the conventional optical receivers draw large currents due to use of one or more tail current sinks employed in the CML latches, the dynamic voltage slicer as used in the AFE of the present disclosure does not require use of the tail current sinks. Operation of the dynamic voltage slicer in absence of the one or more tail current sinks significantly reduces power consumption by the AFE of the present disclosure.

Additionally, the dynamic voltage slicer enhances operating speed/bandwidth of the AFE of the present disclosure in comparison to that of the conventional optical receivers. In comparison to the AFE of the conventional optical receivers, the dynamic voltage slicer used in the AFE of the present disclosure includes two separate circuits—the preamplifier and the voltage latch circuit. In particular, each of the intermediate voltages generated by the preamplifier drives reduced number of switches in comparison to the number of switches driven by the output terminals of the StrongARM latch employed in the AFE of the conventional optical receivers. Further, each of the intermediate voltages in the preamplifier may be discharged via reduced number switches (as will be described in detail later) in comparison to that of the StrongARM latch employed in the AFE of the conventional optical receivers. Such reduction in the number of switches in discharge paths of the intermediate voltages reduces the resistance/impedance faced during discharge of the intermediate voltage. This reduction in the capacitive load and the resistance/impedance faced during discharge of the intermediate voltages increases the operating speed/bandwidth of the AFE of the present disclosure in comparison to the AFE of the conventional optical receivers.

Referring now to the drawings, in FIG. 1, a block diagram of an AFE 100 is presented, in accordance with an example. As depicted in FIG. 1, the AFE 100 may include an input terminal 102; an output port 104; and a trans-impedance amplifier (TIA) 106, a dynamic voltage slicer 108, and a logic latch 110 disposed between the input terminal 102 and the output port 104. During operation, the AFE 100 may receive an input current ($I_{in}$) at the input terminal 102 and output digital output states, alternatively also referred to as a bit-stream at its output port 104. Although not shown, in some applications, the AFE 100 may be disposed in an optical receiver where the input terminal 102 of the AFE 100 may be coupled to a light sensitive element, for example, a photodiode (not shown). The photodiode may convert incoming light into the input current that is received by the AFE 100 via the input terminal 102. Typically, the input current may have very small magnitude (e.g., in the order of tens to hundreds of microamperes).

In some examples, the TIA 106 may receive the input current from the input terminal 102 and generate a pair of differential voltage signals based on the input current and a reference current ($I_R$). In some examples, the TIA 106 may include a tunable current source 112 to produce the reference current that sets a decision threshold for the dynamic voltage slicer 108 to generate a pair of digital voltages (described later). The differential voltage signals may be available at a first differential voltage output terminal 114 and a second differential voltage output terminal 116 of the TIA 106 and are supplied to the dynamic voltage slicer 108. Hereinafter, the first differential voltage output terminal 114 and the second differential voltage output terminal 116 are collectively referred to as differential voltage output terminals 114, 116.

The dynamic voltage slicer 108 may be coupled to the TIA 106. In particular, input terminals 118, 120 of the dynamic voltage slicer 108 may be coupled to the differential voltage output terminals 114, 116 of the TIA 106 as shown in FIG. 1. The dynamic voltage slicer 108 may receive the pair of the differential voltage signals at its input terminals 118, 120 from the TIA 106 and supply the digital voltages at digital voltage output terminals 122, 124. In some examples, the dynamic voltage slicer 108 may include a preamplifier 126 coupled to a voltage latch circuit 128. The preamplifier 126 and the voltage latch circuit 128 may receive a clock signal having a predetermined frequency, herein after referred to as a clock frequency. The preamplifier 126 may generate a pair of intermediate voltages based on the pair of the differential voltage signals sampled at the clock frequency and supply the pair of the intermediate voltages to the voltage latch circuit 128. The voltage latch circuit 128 may regenerate a pair of the digital voltages based on the pair of the intermediate voltages. The pair of the digital voltages may be available at the digital voltage output terminals 122, 124 of the dynamic voltage slicer 108.

Moreover, the logic latch 110 may be coupled to the dynamic voltage slicer 108 at the digital voltage output terminals 122, 124. The logic latch 110 may generate digital output states based on the pair of the digital voltages. The digital output states may be available at the output port 104 of the AFE 100. For example, the output port 104 may include two output terminals 130, 132. A digital output state generated by the logic latch 110 may include either "0" or "1." The digital output state at the output terminals 130, 132 are complement of each other. For example, if the digital output state at the output terminal 130 is "1," the digital output state at the output terminal 132 is "0," and vice-versa. Additional details regarding hardware included in each of the TIA 106, the dynamic voltage slicer 108, and the logic latch 110 and operations performed by the same will be described in conjunction with FIG. 2.

Figure 2:
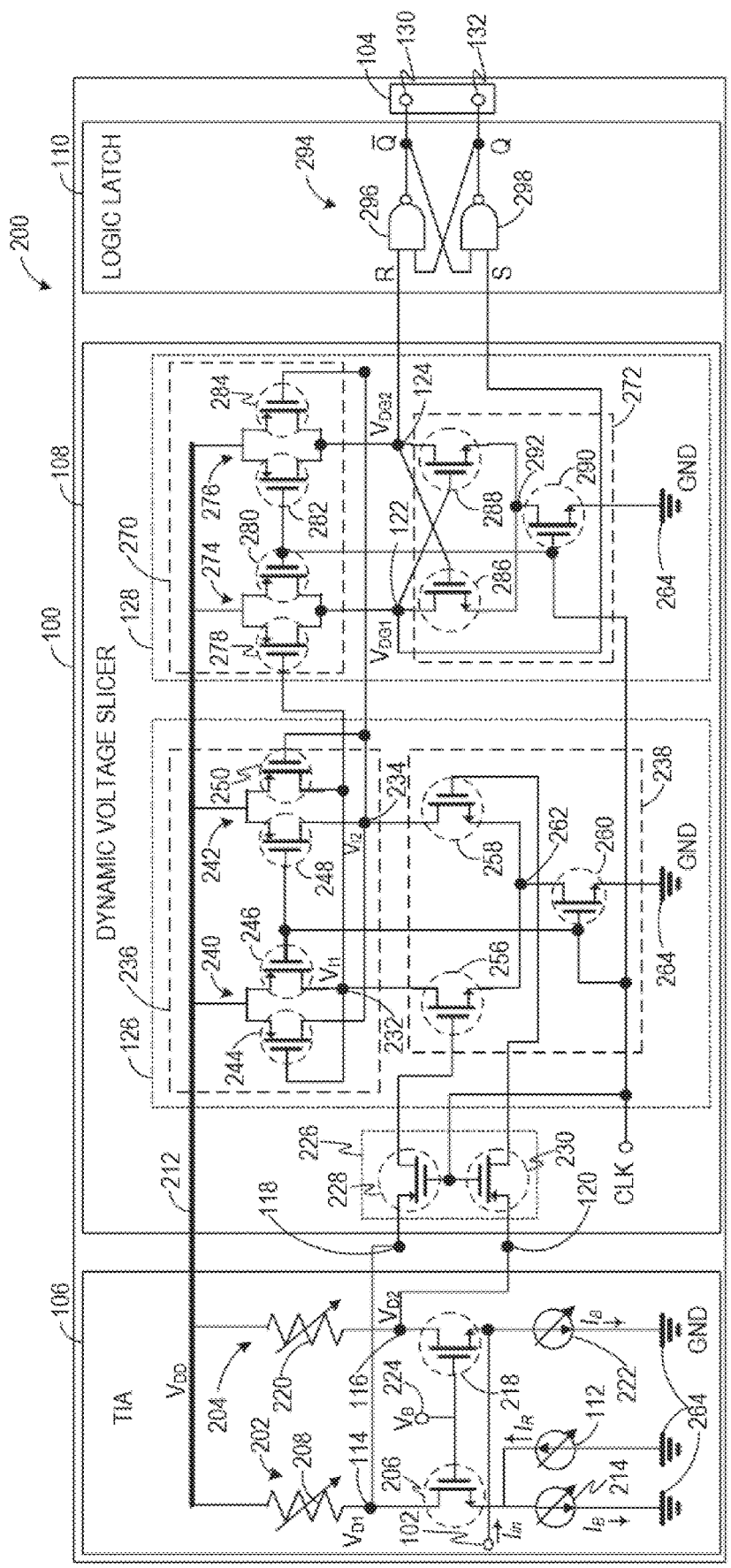
FIG. 2 depicts a schematic diagram of the AFE shown in FIG. 1, in accordance with an example.

Moving now to FIG. 2, a schematic diagram 200 of the AFE 100 of FIG. 1 is presented, in accordance with an example. In some examples, the TIA 106 may include a circuit including one or more common gate amplifiers, resistors, and current sources. In the example of FIG. 2, the TIA 106 is formed using a first current path 202 and a second current path 204. The first current path 202 may include a first common-gate (CG) amplifier 206, a first resistor 208, and the tunable current source 112. Although the first CG amplifier 206 is shown as implemented using an N-channel MOSFET, in some other examples, other types of switches including, but not limited to, P-channel MOSFET, a bipolar-junction transistor (BJT), a thyristor, Insulated-Gate Bipolar Transistor (IGBT), and the like, may also be employed to implement the first CG amplifier 206 with appropriate circuit modifications.

In the first current path 202, the first CG amplifier 206 is coupled in series with the first resistor 208, and the tunable current source 112. In particular, the first resistor 208 is connected between a power supply line 212 and a power terminal (e.g., a drain terminal) of the first CG amplifier 206. Further, another power terminal (e.g., a source terminal) of the first CG amplifier 206 is coupled to the tunable current source 112. In some examples, the first current path 202 may include an additional current source 214 coupled in parallel with the tunable current source 112, as depicted in FIG. 2. The tunable current source 112 may supply a reference current ($I_R$) to the first amplifier 206 that sets a decision threshold for the dynamic voltage slicer 108. Further, the first current path 202 may include the first differential voltage terminal 114 connected at an interconnection between the first CG amplifier 206 and the first resistor 208. During operation of the TIA 106, a first differential voltage $V_{D1}$ may appear at the first differential voltage terminal 114.

Further, in some examples, the second current path 204 may include a second CG amplifier 218, a second resistor 220, and a current source 222. Although the second CG amplifier 218 is shown as implemented using an N-channel MOSFET, in some other examples, other types of switches including, but not limited to, the P-channel MOSFET, the BJT, the thyristor, the IGBT, and the like, may also be employed to implement the second CG amplifier 218 with appropriate circuit modifications. In the second current path 204, the second CG amplifier 218 is coupled in series with the second resistor 220, and the current source 222. In particular, the second resistor 220 is connected between the power supply line 212 and a power terminal (e.g., a drain terminal) of the second CG amplifier 218. Further, another power terminal (e.g., a source terminal) of the second CG amplifier 218 is coupled to the current source 222. Furthermore, the second current path 204 may include the second differential voltage terminal 116 connected at an interconnection between the second CG amplifier 218 and the second resistor 220. During operation of the TIA 106, a second differential voltage $VD_2$ may appear at the second differential voltage terminal 116. Hereinafter, the first differential voltage $VD_1$ and the second differential voltage $VD_2$ are also referred to as differential voltages $VD_1$ and $VD_2$.

Figure 3:
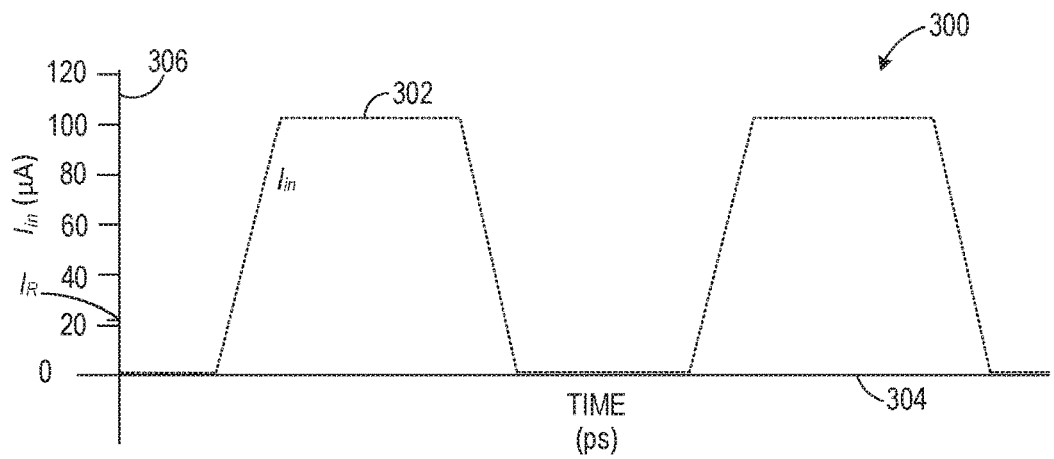
FIG. 3 depicts a graphical representation showing a waveform of an input current, in accordance with an example.

Moreover, the input terminal 102 of the AFE 100 may be connected to the source terminal of the second CG amplifier 218. As previously noted, the input terminal 102 may be connected to a photodiode (not shown) that generates an input current ($I_{in}$). The input current (see FIG. 3) may flow from the input terminal 102 to the source terminal of the second CG amplifier 218. Referring now to FIG. 3, a graphical representation 300 showing a waveform 302 of the input current ($I_{in}$), in accordance with an example. In the graphical representation 300, the reference numeral 304 represents an X-axis representing time in pico-seconds (ps) for example. Further, the reference numeral 306 represents a Y-axis representing current in microamperes (μA), for example. In the example implementation of FIG. 2 and as depicted in FIG. 3, the input current ($I_{in}$) may have a peak-to-peak magnitude of 100 μA at 25 Gigabits-per-second (Gb/s) data rate. Further, for illustration purposes in the example of FIG. 3, a magnitude of the reference current ($I_R$) is shown as being about 20 μA. In some other examples, the reference current ($I_R$) may be set to any suitable magnitude.

Referring again to FIG. 2, in some examples, the control terminals (e.g., gate terminals) of both the first CG amplifier 206 and the second CG amplifier 218 are connected together at a common terminal 224. In some examples, the common terminal 224 is supplied with a biasing voltage ($V_B$). Further, the CG amplifiers 206, 218 are also supplied with biasing currents ($I_B$) from the current sources 214 and 222, respectively. Accordingly, when the biasing voltage and the biasing currents ($I_B$) are supplied, both the first CG amplifier 206 and the second CG amplifier 218 may be turned-on and allow a flow of currents there through. Further, a trans-impedance gain of the TIA 106 may be tuned by varying the one or both of the first resistor 208 and the second resistor 220. Moreover, a DC component in the pair of the differential voltages $V_{D1}$ and $V_{D2}$ may be adjusted by controlling the biasing currents ($I_B$) supplied by the current sources 214 and 222, respectively.

Furthermore, in some examples, the differential voltage $V_{D1}$ at the differential voltage output terminal 114 may act a reference voltage and is further tunable via the tunable current source 112. For example, the differential voltage $V_{D1}$ may be adjusted by varying the reference current ($I_R$) supplied by the tunable current source 112. Accordingly, if the input current is higher than the reference current supplied from the tunable current source 112, the voltage at the differential voltage terminal 114 will be higher than the voltage at the differential voltage terminal 116 (i.e., $V_{D1} > V_{D2}$). However, if the input current is lower than the reference current, the voltage at the differential voltage terminal 114 will be lower than the voltage at the differential voltage terminal 116 (i.e., $V_{D1} < V_{D2}$). Accordingly, the reference current may cause the generation of the differential voltage signals at the differential voltage terminals 114, 116 based on magnitude of the of the input current.

Further, as previously noted, the differential voltage terminals 114, 116 of the TIA 106 are coupled to the input terminals 118, 120 of the dynamic voltage slicer 108 to supply the differential voltage signals $V_{D1}$ and $V_{D2}$ to the dynamic voltage slicer 108. In some examples, the dynamic voltage slicer 108 may include a voltage sampling circuit 226, the preamplifier 126, and the voltage latch circuit 128. In some examples, each of the voltage sampling circuit 226, the preamplifier 126, and the voltage latch circuit 128 may receive a clock signal (CLK) having a predetermined frequency (also referred to as a clock frequency) from a clock source (not shown) to synchronize the generation of the pair of the intermediate voltages and the pair of the digital voltages. In some examples, the clock source may be implemented using known CDR circuits or any suitable circuits that can generate the clock signal. Discussion regarding the clock source is out of the scope of the present disclosure. At any given point in time, the clock signal may have one of a first state or a second state. For the illustration purposes in the description hereinafter, the first state is defined as being "LOW" and the second state is defined as being "HIGH." In the HIGH state, the clock signal may have a voltage magnitude that is sufficient to turn-on a switch that receives the clock signal. Further, in the LOW state, the clock signal may have a voltage magnitude that is sufficient to turn-off the switch that receives the clock signal.

The voltage sampling circuit 226 may receive the differential voltage signals from the TIA 106 via the input terminals 118, 120 and supply sampled differential voltage signals to the preamplifier 126 when the clock signal is at the first state. The term "sampled differential voltage signal" as used herein may refer to a differential voltage signal when the clock signal is at the first state. For example, at a given time if the clock signal is at the first state, the sampled differential voltage signals may represent the differential voltage signals appearing at the input terminals 118, 120 of the dynamic voltage slicer 108. In an example implementation of FIG. 2, the voltage sampling circuit 226 is shown to include a first sampling switch 228 and a second sampling switch 230 (hereinafter collectively referred to as sampling switches 228,230). As depicted, the sampling switches 228, 230 are coupled between the TIA 106 and the preamplifier 126. In the example of FIG. 2, the sampling switches 228, 230 are shown as being N-channel MOSFETs. Without limiting the scope of the present disclosure, the sampling switches 228, 230 may be implemented using the P-channel MOSFET, the BJT, the thyristor, the IGBT, and the like with appropriate circuit modifications.

In the voltage sampling circuit 226, the sampling switches 228, 230 are implemented such that source terminals of the sampling switches 228, 230 are respectively coupled to the input terminals 118, 120 of the dynamic voltage slicer 108; drain terminals of the sampling switches 228, 230 are coupled respectively to the input terminals 118, 120 of the preamplifier 126; and gate terminals of the sampling switches 228, 230 are connected together. Further, as depicted in FIG. 2, the gate terminals of the sampling switches 228, 230 are fed with the clock signal. Accordingly, the switching of the sampling switches 228, 230 is controlled based on the clock signal. For example, as the sampling switches 228, 230 are P-channel MOSFETs, the sampling switches 228, 230 are turned-on when the clock signal is at the first state (e.g., LOW) and are turned-off when the clock signal is at the second state (e.g., HIGH). Accordingly, when the clock signal is at the first state the voltage sampling circuit 226 may supply the sampled differential voltage signals to the preamplifier 126. However, when the clock signal is at the second state the voltage sampling circuit 226 may hold the sampled differential voltage signals supplied to the preamplifier 126.

The preamplifier 126 of the dynamic voltage slicer 108 may generate a pair of the intermediate voltages, including a first intermediate voltage ($V_{I1}$) and a second intermediate voltage ($V_{I2}$), based on the sampled differential voltages. As depicted in FIG. 2, the intermediate voltages $V_{I1}$, $V_{I2}$ may appear at a first intermediate output terminal 232 and a second intermediate output terminal 234, respectively, of the preamplifier 126. The first intermediate output terminal 232 and the second intermediate output terminal 234 are collectively referred to as intermediate output terminals 232, 234. In order to enable the generation of the intermediate voltages, the preamplifier 126 may include a first reset and amplifier circuit 236 coupled to a differential discharge circuit 238.

In the example implementation shown in FIG. 2, the first reset and amplifier circuit 236 may include a first pair of switches 240 and a second pair of switches 242 coupled between the power supply line 212 and the differential discharge circuit 238. The first pair of switches 240 may include a first switch 244 and a second switch 246. Further, the second pair of switches 242 may include a third switch 248 and a fourth switch 250. Hereinafter, the first switch 244, the second switch 246, the third switch 248, and the fourth switch 250 are collectively referred to as switches 244-250. In the example of FIG. 2, the switches 244-250 are shown as being P-channel MOSFETs. Without limiting the scope of the present disclosure, the switches 244-250 may be implemented using the N-channel MOSFET, the BJT, the thyristor, the IGBT, and the like with appropriate circuit modifications.

As depicted, each of the switches 244-250 may include two power terminals (e.g., a respective drain terminal and a source terminal) and a control terminal (e.g., a respective gate terminal). One power terminal (e.g., the source terminal) of each of the switches 244-250 is coupled to a power supply line 212. Further, other power terminals (e.g., the drain terminals) of the second switch 246 and the fourth switch 250 are coupled to a first intermediate output terminal 232 of the preamplifier 126. In some examples, the drain terminals of the second switch 246 and the fourth switch 250 are coupled directly to the first intermediate output terminal 232 of the preamplifier 126. Furthermore, the other power terminals (e.g., the drain terminals) of the first switch 244 and the third switch 248 are coupled to a second intermediate output terminal 234 of the preamplifier 126. In particular, in certain examples, the drain terminals of the first switch 244 and the third switch 248 are coupled directly to the second intermediate output terminal 234 of the preamplifier 126. Moreover, the first intermediate output terminal 232 is coupled to the control terminal (e.g., the gate terminal) of the first switch 244. Accordingly, the switching of the first switch 244 is controlled based on the first intermediate voltage ($V_{I1}$) appearing at the first intermediate output terminal 232. In addition, the second intermediate output terminal 234 is coupled to the control terminal (e.g., the gate terminal) of the fourth switch 250. Accordingly, the switching of the fourth switch 250 is controlled based on the second intermediate voltage ($V_{I2}$) appearing at the second intermediate output terminal 234. Further, the control terminals (e.g., the gate terminals) of the second switch 246 and the third switch 248 are connected together to receive the clock signal. Accordingly, the switching of the second switch 246 and the third switch 248 is controlled based on the clock signal.

Moreover, in some examples, the differential discharge circuit 238 is coupled to the first reset and amplifier circuit 236 at the intermediate output terminals 232, 234. In the example implementation shown in FIG. 2, the differential discharge circuit 238 may include a fifth switch 256, a sixth switch 258, and a common switch 260, hereinafter collectively referred to as switches 256-260. For illustration purposes, the fifth switch 256, the sixth switch 258, and the common switch 260 are shown as being N-channel MOSFETs. The fifth switch 256 is coupled between the first intermediate output terminal 232 and a common terminal 262. More particularly, the fifth switch 256 is disposed such that the drain terminal and the source terminal of the fifth switch 256 are respectively connected to the first intermediate output terminal 232 and the common terminal 262. Further, the control terminal (e.g., the gate terminal) of the fifth switch 256 is connected to the first sampling switch 228. Accordingly, the switching of the fifth switch 256 may be controlled based on the differential signal appearing at the first differential output terminal 114 that is sampled by the first sampling switch 228 (e.g., $VD_1$ when clock signal is at the first state).

Further, the sixth switch 258 is coupled between the second intermediate output terminal 234 and the common terminal 262. In particular, the sixth switch 258 is disposed such that the drain terminal and the source terminal of the sixth switch are respectively connected to the second intermediate output terminal 234 and the common terminal 262. Further, the control terminal (e.g., the gate terminal) of the sixth switch 258 is connected to the second sampling switch 230. Accordingly, the switching of the sixth switch 258 may be controlled via the differential signal appearing at the second differential output terminal 116 that is sampled by the second sampling switch 230 (e.g., $V_{D2}$ when clock signal is at the first state).

Moreover, the common switch 260 is coupled between the common terminal 262 and a ground terminal 264. In particular, as depicted, the drain terminal and the source terminal of the common switch 260 are respectively connected to the common terminal 262 and the ground terminal 264. Further, the control terminal (e.g., the gate terminal) of the common switch 260 receives the clock signal. Accordingly, the switching of the common switch 260 may be controlled via the clock signal. During operation (as described in greater details below), a first series circuit of the fifth switch 256 and the common switch 260 forms a discharge path for one of the pair of the intermediate voltages (e.g., for the first intermediate voltage $V_{I1}$), and a second series circuit of the sixth switch 258 and the common switch 260 forms a discharge path for the other one of the pair of the intermediate voltages (e.g., for the second intermediate voltage $V_{I2}$).

Operation of the preamplifier 126 may be controlled based on the clock signal and the sampled differential voltage signals received from the voltage sampling circuit 226. For example, during operation of the AFE 100, as previously noted, when the clock signal is at the first state, the voltage sampling circuit 226 may supply the sampled differential voltage signals to the preamplifier 126. Accordingly, the preamplifier 126 may receive the sampled differential voltage signals from the voltage sampling circuit 226 when the clock signal is at the first state. In particular, the sampled differential voltage signals may appear at the gate terminals of the fifth switch 256 and the sixth switch 258 of the differential discharge circuit 238.

Further, the first reset and amplifier circuit 236 of the preamplifier may reset the pair of the intermediate voltages ($V_{I1}$ and $V_{I2}$) to a predetermined voltage level when clock signal is at the first state. In particular, the second switch 246 and third switch 248 of the first reset and amplifier circuit 236 may be turned-on when the clock signal is at the first state (e.g., LOW). Since the second switch 246 and third switch 248 are turned-on, the intermediate voltages $V_{I1}$ and $V_{I2}$ at the intermediate voltage terminals 232 and 234, respectively, are reset to a voltage level of the power supply line 212 (e.g., $V_{DD}$, also referred to as supply voltage). Moreover, when the clock signal is at the first state, the common switch 260 may remain turned-off, thereby disabling the discharge paths for the intermediate voltages. Additionally, since the intermediate voltages ($V_{I1}$ and $V_{I2}$) are reset to the supply voltage, the first switch 244 and the fourth switch 250 remain turned-off, thereby blocking flow of any discharge current there through.

Further, when the clock signal is at the second state (e.g., HIGH), the common switch 260 may be turned-on, thereby enabling the discharge paths to allow discharge of the pair of the intermediate voltages ($V_{I1}$ and $V_{I2}$). For example, when the common switch 260 is turned-on, a first discharge current may flow via the series circuit of the fifth switch 256 and the common switch 260, and a second discharge current may flow via the series circuit of the sixth switch 258 and the common switch 260. However, magnitude of the first discharge current and the second discharge current and hence, a discharge rate of each of the intermediate voltages ($V_{I1}$ and $V_{I2}$) may depend on the magnitudes of the sampled differential voltages received at the gate terminals of the fifth switch 256 and the sixth switch 258, respectively. A switch of the fifth switch 256 and the sixth switch 258 that receives the sampled differential voltage with higher magnitude allows larger discharge current to flow there-though. Accordingly, respective intermediate voltage may drop faster via a respective discharge path in comparison to the other one of the pair of the intermediate voltages. For example, if a magnitude of the sampled differential voltage received by the fifth switch 256 is higher in comparison to a magnitude of the sampled differential voltage received by the sixth switch 258 (i.e., $VD_1 > VD_2$), the intermediate voltage $V_{I1}$ appearing at the first intermediate voltage terminal 232 drops faster in comparison to the intermediate voltage $V_{I2}$ appearing at the second intermediate voltage terminal 234, and vice-versa.

Moreover, a given intermediate voltage terminal of the intermediate voltage terminals 232, 234 whose voltage drops faster may in-turn cause a switch of the first reset and amplifier circuit 236 to which the given intermediate voltage terminal is connected, to turn-on. In the above-mentioned example, if the intermediate voltage $V_{I1}$ drops faster in comparison to the intermediate voltage $V_{I2}$, the first switch 244 may be turned-on. Accordingly, when the first switch 244 is turned-on, the intermediate voltage $V_{I2}$ appearing at the second intermediate voltage terminal 234 may be set to recharge toward the supply voltage (e.g., $V_{DD}$). In particular, while intermediate voltage $V_{I1}$ may drop from the supply voltage to about half of the supply voltage, the intermediate voltage $V_{I2}$ is again recharged to the supply voltage. In summary, a given intermediate voltage of the intermediate voltages ($V_{I1}$ and $V_{I2}$) that drops faster stops the other intermediate voltage from dropping further via its discharge path and causes the magnitude of the other intermediate voltage to recharge to the supply voltage. Table-1 presented below summarizes example values of the intermediate voltages $V_{I1}$ and $V_{I2}$ for different states of the clock signal and different values of the differential voltages.

TABLE 1

Example values of the intermediate voltages

| | | Intermediate Voltages | |
|---|---|---|---|
| | | $V_{I1}$ | $V_{I2}$ |
| Differential Voltage | CLK at First state (LOW) | $V_{DD}$ | $V_{DD}$ |
| VD1 > VD2 (i.e., $I_{in} > I_R$) | CLK at Second state (HIGH) | Lower than $V_{I2}$ | Higher than $V_{I1}$ |
| Differential Voltage | CLK at First state (LOW) | $V_{DD}$ | $V_{DD}$ |
| VD1 < VD2 (i.e., $I_{in} < I_R$) | CLK at Second state (HIGH) | Higher than $V_{I2}$ | Lower than $V_{I1}$ |

Figure 4:
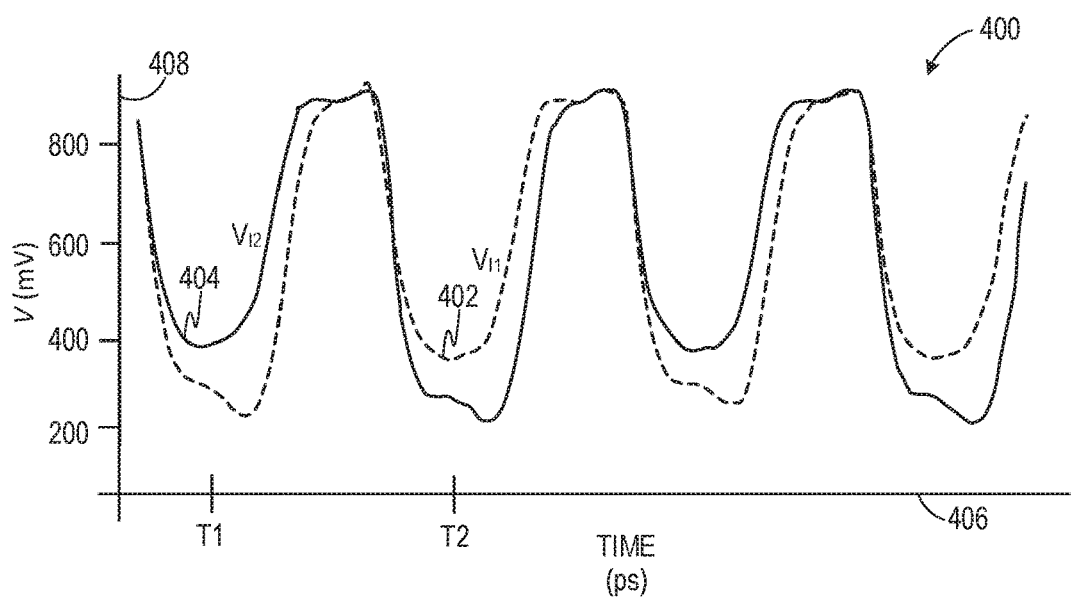
FIG. 4 depicts a graphical representation showing waveforms of intermediate voltages generated by a preamplifier of a dynamic voltage slicer, in accordance with an example.

For illustration purposes, example waveforms of the intermediate voltages $V_{I1}$ and $V_{I2}$ are shown in FIG. 4. Referring now to FIG. 4, a graphical representation showing waveforms 402 and 404 respectively of the intermediate voltages $V_{I1}$ and $V_{I2}$ generated by the preamplifier 126 and sampled with the clock frequency of 25 GHz depicted, in accordance with an example. In the graphical representation 400, the reference numeral 406 represents an X-axis representing time in pico-seconds (ps), for example, which is depicted in time-synchronization with the X-axis 304 of FIG. 3. Further, the reference numeral 408 represents a Y-axis representing voltage in millivolts (mV), for example. In the example of FIG. 4, the maximum magnitude of the intermediate voltages $V_{I1}$ (represented by a dashed line waveform 402) and $V_{I2}$ (represented by a solid line waveform 404) is shown as being about 900 mV that is the magnitude of the supply voltage (e.g., $V_{DD}$). By way of example, as described above, when the input current (see FIG. 3, $I_{in}$ 0 µA) is lower than the reference current $I_R$, the first intermediate voltage $V_{I1}$ may be lower than the second intermediate voltage $V_{I2}$ (see at time T1 in FIG. 4), because of the faster discharging rate of $V_{I1}$ compared with $V_{I2}$. Similarly, when the input current is greater than the reference current (see FIG. 3, $I_{in}$ being about 100 µA), the first intermediate voltage $V_{I1}$ may be higher than the second intermediate voltage $V_{I2}$ (see at time T2 in FIG. 4), because of the slower discharging rate compared with $V_{I2}$. As described hereinabove, the reference current $I_R$ sets a decision threshold for generating the intermediate voltages $V_{I1}$ and $V_{I2}$.

Referring back to FIG. 2, the preamplifier 126 may be coupled to the voltage latch circuit 128 to supply the pair of the intermediate voltages thereto. The voltage latch circuit 128 may generate a pair of the digital voltages, for example, a first digital voltage $V_{DG1}$ and a second digital voltage $V_{DG2}$, that are available at the first and second digital voltage output terminals 122, 124, respectively, of the voltage latch circuit 128. The voltage latch circuit 128 may include a second reset and amplifier circuit 270 coupled to a cross-coupled latch circuit 272. In the example implementation of FIG. 2, the second reset and amplifier circuit 270 is formed using a first pair of parallel switches 274 and a second pair of parallel switches 276. The first pair of parallel switches 274 may include switches 278 and 280 that are coupled between the power supply line 212 and the first digital voltage output terminal 122. In some examples, the switches 278 and 280 are disposed such that source terminals of the switches 278 and 280 are connected to the power supply line 212 and the drain terminals of the switches 278 and 280 are connected to the first digital voltage output terminal 122. Further, the second pair of parallel switches 276 may include switches 282 and 284 that are coupled between the power supply line 212 and the second digital voltage output terminal 124. In particular, the switches 282 and 284 are disposed such that the source terminals of the switches 282 and 284 are connected to the power supply line 212 and the drain terminals of the switches 282 and 284 are connected to the second digital voltage output terminal 124.

Moreover, in some examples, one switch in each of the first pair of parallel switches 274 and the second pair of parallel switches 276 is controlled via respective ones of the pair of the intermediate voltages $V_{I1}$ and $V_{I2}$, and the remaining switches of the first pair of parallel switches 274 and the second pair of parallel switches 276 are controlled via the clock signal. To enable such control of the first pair of parallel switches 274 and the second pair of parallel switches 276, the gate terminals of the switches 280 and 282 are connected together to receive the clock signal and the gate terminals of the switches 278 and 284 are respectively connected to the first intermediate output terminal 232 and the second intermediate output terminal 234 of the preamplifier 126. Accordingly, the switching of the switches 280, 282 is controlled based on the clock signal. Further, and the switching of the switches 278, 284 is controlled based on the intermediate voltage signals $V_{I1}$ and $V_{I2}$, respectively.

Further, the cross-coupled latch circuit 272 is connected to the second reset and amplifier circuit 270 at the digital voltage output terminals 122, 124. The cross-coupled latch circuit 272 may regenerate the pair of the digital voltages at the first digital voltage output terminal 122 and the second digital voltage output terminal 124 to either a ground-level voltage or a supply-level digital voltage. The enable such regeneration of the pair of the digital voltages, in some examples, the cross-coupled latch circuit 272, may include arrangement of switches 286, 288, and 290.

The switch 286 is coupled between the first digital voltage output terminal 122 and a common terminal 292. More particularly, the switch 286 is disposed such that the drain terminal and the source terminal of the switch 286 are respectively connected to the first digital voltage output terminal 122 and the common terminal 292. Further, the control terminal (e.g., the gate terminal) of the switch 286 is connected to the second digital voltage output terminal 124. Accordingly, the switching of the switch 286 may be controlled via the second digital voltage $V_{DG2}$ appearing at the second digital voltage output terminal 124.

Further, the switch 288 is coupled between the second digital voltage output terminal 124 and the common terminal 292. More particularly, the switch 288 is disposed such that the drain terminal and the source terminal of the switch 288 are respectively connected to the second digital voltage output terminal 124 and the common terminal 292. Further, the control terminal (e.g., the gate terminal) of the switch 288 is connected to the first digital voltage output terminal 122. Accordingly, the switching of the switch 288 may be controlled via the first digital voltage $V_{DG1}$ appearing at the first digital voltage output terminal 122.

Moreover, the switch 290 is coupled between the common terminal 292 and the ground terminal 264. In particular, as depicted, the drain terminal and the source terminal of the switch 290 are respectively connected to the common terminal 292 and the ground terminal 264. Further, the control terminal (e.g., the gate terminal) of the switch 290 receives the clock signal. Accordingly, the switching of the switch 290 may be controlled based on the clock signal.

Operation of the voltage latch circuit 128 may be controlled based on the clock signal and the pair of the intermediate voltages ($V_{I1}$ and $V_{I2}$) received from the preamplifier 126. For example, during the operation of the AFE 100, the voltage latch circuit 128 may receive the pair of the intermediate voltages ($V_{I1}$ and $V_{I2}$) from the preamplifier 126. In particular, the intermediate voltages $V_{I1}$ and $V_{I2}$ may appear at the gate terminals of the switches 278, 284, respectively, of the second reset and amplifier circuit 270. In particular, the second reset and amplifier circuit 270 may reset the first digital voltage $V_{DG1}$ and the second digital voltage $V_{DG2}$ to a predetermined voltage level when clock signal is at the first state (e.g., LOW). In particular, when the clock signal is at the first state, the switches 280 and 282 of the second reset and amplifier circuit 270 may be turned-on, causing the first digital voltage $V_{DG1}$ and the second digital voltage $V_{DG2}$ respectively at the digital voltage output terminals 122 and 124 to reset to the supply voltage ($V_{DD}$). Moreover, when the clock signal is at the first state, the switch 290 may remain turned-off, thereby latching/retaining the first digital voltage $V_{DG1}$ and the second digital voltage $V_{DG2}$ at the supply voltage.

Further, when the clock signal is at the second state (e.g., HIGH), the switch 290 may be turned-on, thereby enabling a regeneration of the first digital voltage $V_{DG1}$ and the second digital voltage $V_{DG2}$. For example, when the clock signal transitions to the second state, both the first digital voltage $V_{DG1}$ and the second digital voltage $V_{DG2}$ may momentarily starts to drop as the switches 286, 288 were turned-on previously, and the switch 290 turns-on. The regeneration of the first digital voltage $V_{DG1}$ and the second digital voltage $V_{DG2}$ may also be contributed by operation of the switches 278 and 284 when the clock signal is at the second state. As previously described, when the clock signal is at the second state, the intermediate voltages $V_{I1}$ and $V_{I2}$ may remain differential (see Table-1). For example, when $V_{I2} > V_{I1}$, the switch 278 may be turned-on while the switch 284 may remain turned-off.

Moreover, since the clock signal is at the second state, the switches 280 and 282 are turned-off. Accordingly, the first digital voltage $V_{DG1}$ may rise to the supply voltage, which may turn-on the switch 288. Consequently, the second digital voltage $V_{DG2}$ may remain at the ground potential. As the first digital voltage $V_{DG1}$ reaches the supply voltage and remains at the supply voltage as long as the clock signal is at the second state, the switch 288 remains turned-on, and the second digital voltage $V_{DG2}$ remains at the ground potential. In an alternative example, in a similar fashion, when $V_{I1} > V_{I2}$, as long as the clock signal is at the second state, the second digital voltage $V_{DG2}$ may remain at the supply level causing the switch 286 to remain turned-on and the first digital voltage $V_{DG1}$ to remain at the ground potential. Table-2 presented below summarizes example values of the digital voltages for different states of the clock signal.

TABLE 2

Example values of the digital voltages ($V_{DG1}$ and $V_{DG2}$)

| | | Digital Voltages | |
|---|---|---|---|
| | | $V_{DG1}$ | $V_{DG2}$ |
| Intermediate Voltage | CLK at First state (LOW) | $V_{DD}$ | $V_{DD}$ |
| $V_{I2} > V_{I1}$ | CLK at Second state (HIGH) | $V_{DD}$ | Ground potential (e.g., zero Volt) |
| Intermediate Voltage | CLK at First state (LOW) | $V_{DD}$ | $V_{DD}$ |
| $V_{I1} > V_{I2}$ | CLK at Second state (HIGH) | Ground potential (e.g., zero Volt) | $V_{DD}$ |

Figure 5:
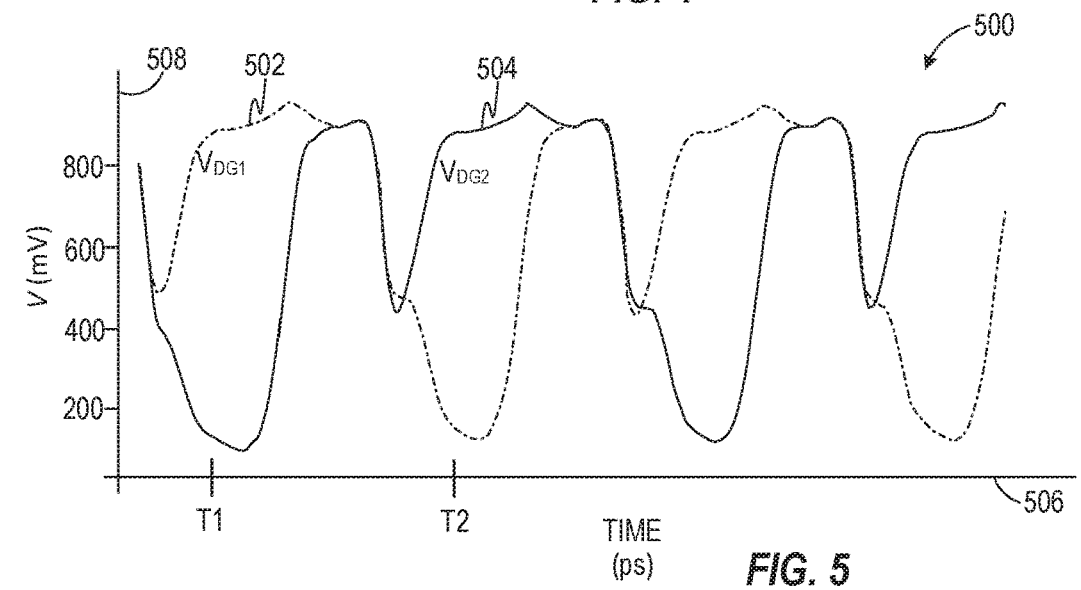
FIG. 5 depicts a graphical representation showing waveforms of digital voltages generated by the dynamic voltage slicer, in accordance with an example.

For illustration purposes, example waveforms of the digital voltages $V_{DG1}$ and $V_{DG2}$ are shown in FIG. 5. Referring now to FIG. 5, a graphical representation showing waveforms 502 and 504 respectively of the digital voltages $V_{DG1}$ and $V_{DG2}$ generated by the voltage latch circuit 128 and sampled with the clock frequency of 25 GHz is depicted, in accordance with an example. In the graphical representation 500, the reference numeral 506 represents an X-axis representing time in pico-seconds (ps), for example, which is depicted in time-synchronization with the X-axis 304 of FIG. 3. Further, the reference numeral 508 represents a Y-axis representing voltage in millivolts (mV), for example. The waveform 502 represented by a dashed-dot line represents the first digital voltage $V_{DG1}$ appearing at the first digital voltage output terminal 122. Further, the waveform 504 represented by a solid line represents the second digital voltage $V_{DG2}$ appearing at the second digital voltage output terminal 124.

The maximum magnitude of the digital voltages $V_{DG1}$ and $V_{DG2}$ may be about 900 mV that is the magnitude of the supply voltage (e.g., $V_{DD}$) on the power supply line 212. By way of example, as described above, when the input current is low (see FIG. 3, $I_{in}$ being about 0 µA), the first intermediate voltage $V_{I1}$ may be lower than the second intermediate voltage $V_{I2}$ (see FIG. 4) and the digital voltage $V_{I2}$ will be at the supply voltage and the digital voltage $V_{DG2}$ will be at the ground potential (see at time T1 in FIG. 4). Similarly, when the input current is high (see FIG. 3, $I_{in}$ being about 100 µA), the first intermediate voltage $V_{I1}$ may be higher than the second intermediate voltage $V_{I2}$ (see FIG. 4) and the digital voltage $V_{DG1}$ will be at the ground potential and the digital voltage $V_{DG2}$ will be at the supply voltage (see at time T2 in FIG. 4).

Moving back to FIG. 2, in some examples, the first digital voltage $V_{DG1}$ and the second digital voltage $V_{DG2}$ from the voltage latch circuit 128 may be fed to a logic latch circuit 110. For illustration purposes, in FIG. 2, the logic latch circuit 110 is shown as implemented using an SR (set-reset) latch 294 formed using logical NAND gates 296, 298. The SR latch 294 may have inputs "S" and "R" and outputs "Q" and "Q̄". The voltage latch circuit 128 may be coupled to the logic latch circuit 110 such that the first and second digital voltage output terminals 122, 124 are respectively connected to an "S" and "R" inputs of the SR latch 294. Further, the outputs "Q" and "Q̄" of the SR latch 294 may be available at the terminals 130 and 132, respectively, of the output port 104 of the AFE 100. As will be appreciated, the logic latch circuit 110 may output digital output states based on the pair of the digital voltages ($V_{DG1}$ and $V_{DG2}$). For example, digital output states may represent bits "1" or "0." Table-3 presented below summarizes example values of the digital output states corresponding to different values of the digital voltages $V_{DG1}$ and $V_{DG2}$.

TABLE 3

Example values of the digital output states

| $V_{DG1}$ | $V_{DG2}$ | Q | Q̄ |
|---|---|---|---|
| $V_{DD}$ | Ground potential | 1 | 0 |
| Ground potential | $V_{DD}$ | 0 | 1 |
| $V_{DD}$ | $V_{DD}$ | Previous State | Previous State |

As will be appreciated, in accordance with some examples, the AFE 100 may generate digital output states (i.e., a bit stream of ones and zeros) for the input current of very little magnitude (e.g., of the order of microamperes) event at high frequencies. This is achieved at least partially based on various technical enhancements captured in the AFE 100. For example, in comparison to trans-impedance amplifiers used in AFE of conventional optical receivers that typically produce a single-ended output, the TIA 106 implemented in the AFE 100 of the present disclosure produces differential voltages based on the input current ($I_{in}$) and the reference current ($I_R$). In particular, use of the differential voltages generated by the TIA 106 enhances decision making by the dynamic voltage slicer 108 to generate clearly differentiating digital voltages (e.g., at the levels of $V_{DD}$ and ground potential). In particular, as described with help of Tables 1-3, when the input current ($I_{in}$) is greater than the reference current ($I_R$), the AFE 100 may generate digital output state (Q) of 1 at its output terminal 132. Alternatively, when the input current ($I_{in}$) is lower than the reference current ($I_R$), the AFE 100 may generate digital output state (Q) of 0 at its output terminal 132. Further, while the CML latches used in the AFE of the conventional optical receivers draw large currents due to use of one or more tail current sinks employed in the CML latches, the dynamic voltage slicer 108 as used in the AFE 100 of the present disclosure does not require use of the tail current sinks. Operation of the dynamic voltage slicer 108 in absence of the one or more tail current sinks significantly reduces power consumption by the AFE 100.

Additionally, the dynamic voltage slicer 108 enhances operating speed/bandwidth of the AFE 100 in comparison to the conventional optical receivers. By way of example, as previously noted, the conventional optical receivers employs the StrongARM latch that is prone to slow-speed operation as it exhibits increased output impedance and capacitive load. In particular, each of output terminals of the StrongARM latch employed in the AFE of the conventional optical receivers generally drives (e.g., controls switching) several switches that increases the capacitive load on the output terminals of the StrongARM latch. Further, voltages at the output terminals of the StrongARM latch also discharge via several switches, thereby facing increased resistance/impedance in the discharge of the voltages at the output terminals of the StrongARM latch. Such increased capacitive load and the resistance/impedance experienced by the StrongARM latch slows-down an operating speed/bandwidth of the AFE of the conventional optical receivers.

In comparison to the AFE of the conventional optical receivers, in the AFE 100 of the present disclosure, the dynamic voltage slicer includes two separate circuits—the preamplifier 126 and the voltage latch circuit 128. In particular, each of the intermediate voltages $V_{I1}$ and $V_{I2}$ appearing respectively at the intermediate voltage terminals 232 and 234 drives reduced number of switches in comparison to the number of switches driven by the output terminals of the StrongARM latch employed in the AFE of the conventional optical receivers. By way of example, each of the intermediate voltage terminals 232 and 234 may only drive two switches that reduces capacitive load on each of the intermediate voltage terminals 232 and 234. Further, each of the intermediate voltages $V_{I1}$ and $V_{I2}$ may discharge via reduced number switches in comparison to that of the StrongARM latch employed in the AFE of the conventional optical receivers. For example, each of the intermediate voltages $V_{I1}$ and $V_{I2}$ may discharge via two switches in the respective discharge paths that reduce the resistance/impedance faced during discharge of the intermediate voltage $V_{I1}$ and $V_{I2}$. Such reduction in the capacitive load and the resistance/impedance faced during discharge of the intermediate voltages $V_{I1}$ and $V_{I2}$ increases the operating speed/bandwidth of the AFE 100 in comparison to the AFE of the conventional optical receivers.

Figure 6:
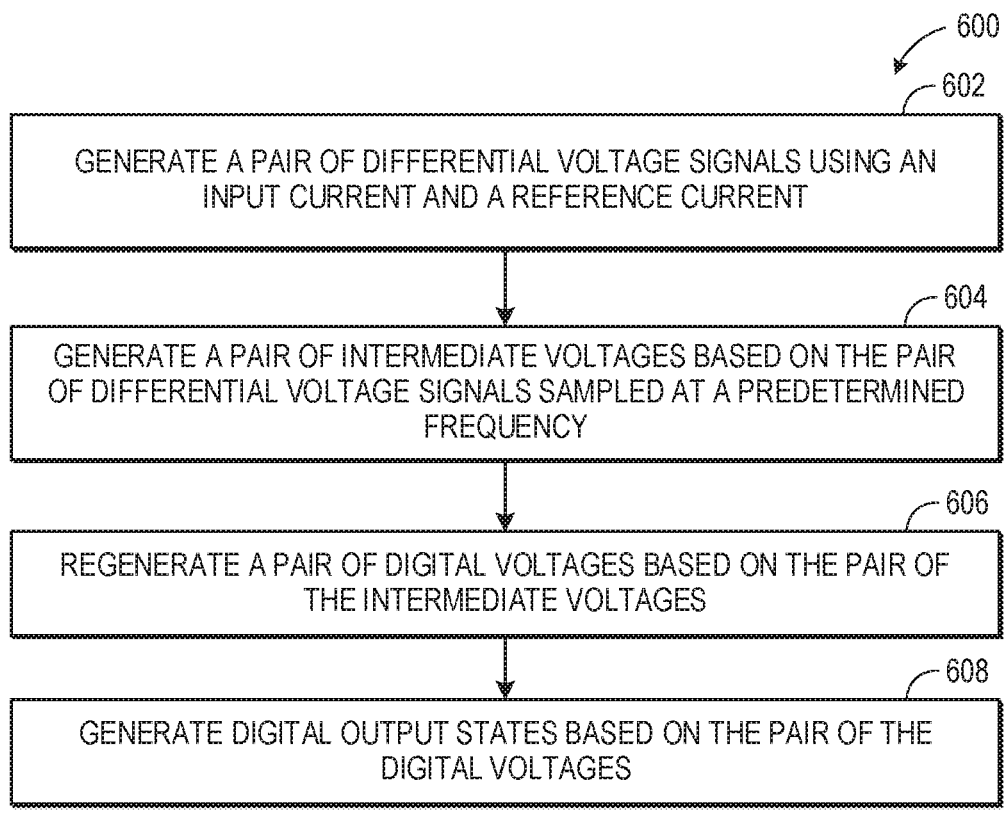
FIG. 6 is a flow diagram depicting a method for generating a digital output states from an input current, in accordance with an example.

Moving now to FIG. 6, a flow diagram depicting a method 600 for generating a digital output states from an input current (e.g., the input current $I_{in}$) is presented, in accordance with an example. For illustration purposes, the method 600 is described in conjunction with the AFE 100 described in FIGS. 1 and 2. For brevity, certain details of the operations mentioned in the method 600 that are already described in FIGS. 1 and 2, are not repeated herein. In some examples, at block 602, a pair of differential voltage signals (e.g., differential voltages $VD_1$ and $VD_2$) may be generated by the trans-impedance amplifier 106 based on the input current ($I_{in}$) and a reference current ($I_R$) may be generated. Further, at block 604, a pair of the intermediate voltages (e.g., intermediate voltages $VD_1$ and $VD_2$) may be generated by the preamplifier 126 based on the pair of the differential voltage signals sampled at a predetermined frequency (e.g., a frequency of the clock signal). Furthermore, at block 606, a pair of the digital voltages (e.g., digital voltages $V_{DG1}$ and $V_{DG2}$) are regenerated by the voltage latch circuit 128 based on the pair of the intermediate voltages. Moreover, at block 608, digital output states (e.g., bit stream at the output port 104) are generated by the logic latch 110 based on the pair of the digital voltages.

Figure 7:
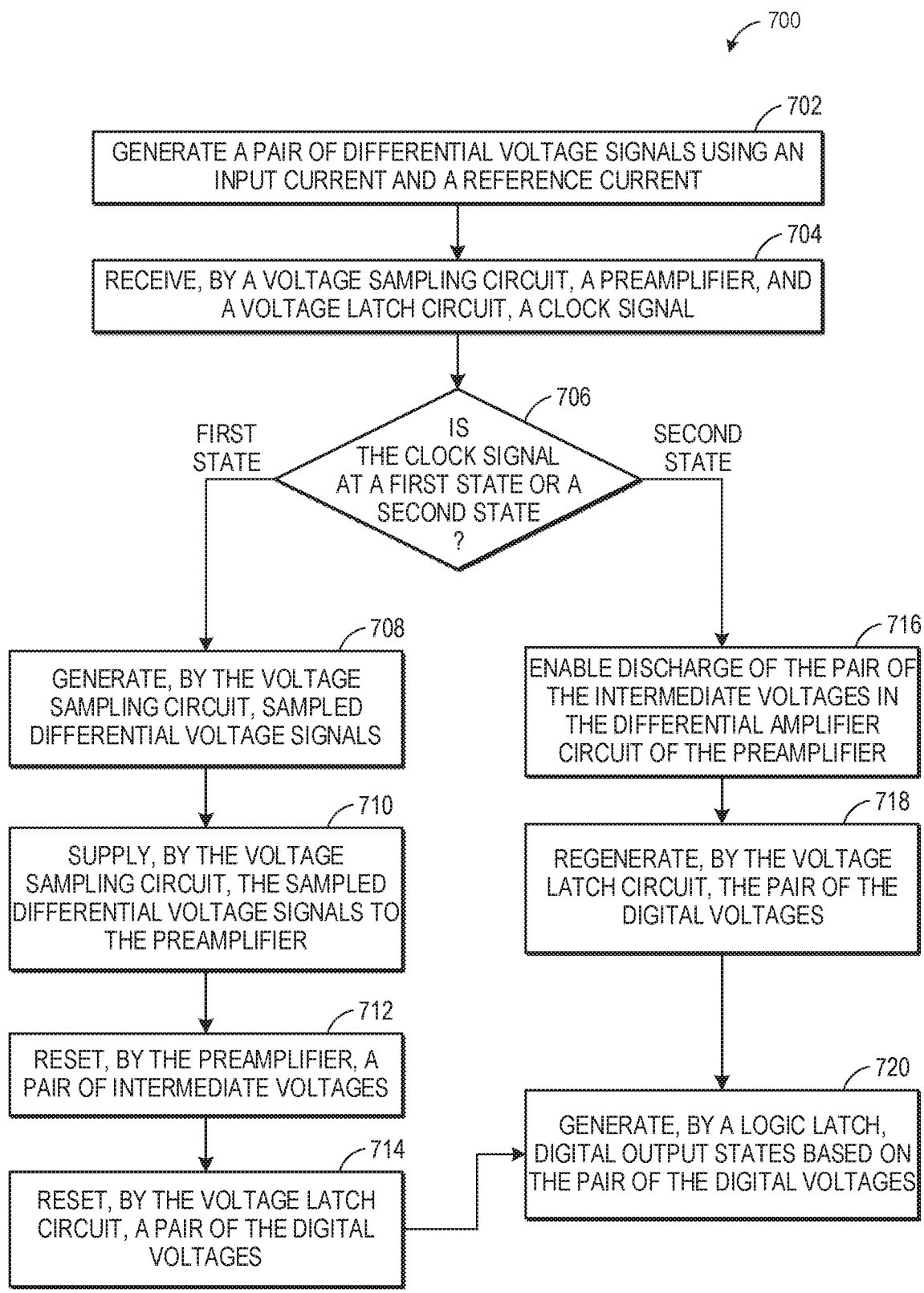
FIG. 7 is a flow diagram depicting a method for generating a digital output states from an input current, in accordance with another example.

Referring now to FIG. 7, a flow diagram depicting a method 700 for generating a digital output states from an input current (e.g., the input current $I_{in}$) is presented, in accordance with an example. For illustration purposes, the method 600 is described in conjunction with the AFE 100 described in FIGS. 1 and 2. For brevity, certain details of the operations mentioned in the method 600 that are already described in FIGS. 1 and 2, are not repeated herein.

At block 702, differential voltage signals (e.g., differential voltages $VD_1$ and $VD_2$) using the input current and the reference current ($I_R$) may be generated by the trans-impedance amplifier 106. Further, at block 704, a clock signal may be received by each of the voltage sampling circuit 226, the preamplifier 126, and the voltage latch circuit 128 of the dynamic voltage slicer 108. Further, depending of state of the clock signal, each of the voltage sampling circuit 226, the preamplifier 126, and the voltage latch circuit 128 may perform respective operation. For example, at block 706, if the clock signal is at the first state, at block 708, the voltage sampling circuit 226 may generate sampled differential voltage signals. Further, when the clock signal is at the first state, at bock 710, the sampled differential voltage signals are supplied from the voltage sampling circuit 226 to the preamplifier 126. Furthermore, when the clock signal is at the first state, at bock 712, the pair of intermediate voltages (e.g., intermediate voltages $VD_1$ and $VD_2$) may be reset to a predetermined voltage level (e.g., the supply voltage $V_{DD}$). Moreover, when the clock signal is at the first state, at bock 714, the pair of digital voltages (e.g., digital voltages $V_{DG1}$ and $V_{DG2}$) may also be reset to the predetermined voltage level.

Referring again to block 706, if the clock signal is at the second state, at block 716, discharge of the pair of the intermediate voltages may be enabled in the differential discharge circuit 238. In particular, when the discharge of the intermediate voltages is enabled, one of the pair of the intermediate voltages starts to drop faster via a respective discharge path of the discharge paths in comparison to the other one of the pair of the intermediate voltages depending on magnitudes of the sampled differential voltage signals received by the preamplifier 126. Furthermore, when the clock signal is at the second state, at bock 718, the pair of the digital voltages may be regenerated by the voltage latch circuit 128. In particular, when the clock signal is at the second state one of the pair of the digital voltages starts to rise faster in comparison to the other one of the pair of the digital voltages based on magnitudes of the pair of the intermediate voltages. Moreover, at block 710, the logic latch 110 may generate the digital output states (e.g., bit stream at the output port 104) based on the pair of the digital voltages. Additional details regarding the operation of each of the TIA 106, the sampling circuit 226, the preamplifier 126, the voltage sampling circuit 128, and the logic latch 110 are described in conjunction with FIG. 2.

While certain implementations have been shown and described above, various changes in from and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An analog front end (AFE) comprising:
   a trans-impedance amplifier to receive an input current and generate a pair of differential voltage signals based on the input current and a reference current; and
   a dynamic voltage slicer to receive the pair of the differential voltage signals at input terminals and supply digital voltages at output terminals, wherein the dynamic voltage slicer comprises:
      a preamplifier to generate a pair of intermediate voltages based on the pair of the differential voltage signals sampled at a predetermined frequency; and
      a voltage latch to generate a pair of digital voltages based on the pair of the intermediate voltages; and
   a logic latch coupled to the dynamic voltage slicer to provide digital output states based on the pair of the digital voltages.

2. The AFE of claim 1, wherein the trans-impedance amplifier comprises:
   a first current path comprising a first common-gate (CG) amplifier coupled in series with a first resistor, and a tunable current source to set the reference current for the dynamic voltage slicer, wherein the first current path further comprises a first differential voltage terminal connected at an interconnection between the first CG amplifier and the first resistor; and
   a second current path comprising a second CG amplifier coupled in series with a second resistor, wherein the input current is generated by a light sensitive element coupled to the second CG amplifier, and wherein the second current path further comprises a second differential voltage terminal connected at an interconnection between the second CG amplifier and the second resistor,
   wherein the first differential voltage terminal and the second differential voltage terminal are coupled to the input terminals of the dynamic voltage slicer to supply the pair of the differential voltage signals.

3. The AFE of claim 1, wherein the preamplifier and the voltage latch circuit are to receive a clock signal with the predetermined frequency to synchronize the generation of the pair of the intermediate voltages and the pair of the digital voltages, wherein the clock signal comprises a first state and a second state.

4. The AFE of claim 3, wherein the dynamic voltage slicer further comprises a voltage sampling circuit comprising a first sampling switch and a second sampling switch coupled between the trans-impedance amplifier and the preamplifier, wherein the first sampling switch and the second sampling switch are controllable via the clock signal to supply sampled differential voltage signals to the preamplifier when the clock signal is at the first state.

5. The AFE of claim 3, wherein the preamplifier comprises a first reset and amplifier circuit to:
   reset the pair of the intermediate voltages to a predetermined voltage level when the clock signal is at the first state; and
   when the clock signal is at the second state, cause one of the pair of the intermediate voltages to drop faster in comparison to the other one of the pair of the intermediate voltages depending on magnitudes of the pair of the differential voltage signals received by the preamplifier.

6. The AFE of claim 5, wherein the first reset and amplifier circuit comprises:
   a first pair of switches comprising a first switch and a second switch; and
   a second pair of switches comprising a third switch and a fourth switch, wherein each of the first switch, the second switch, the third switch, and the fourth switch comprises two power terminals and a control terminal, wherein one power terminal of each of the first switch, the second switch, the third switch, and the fourth switch is coupled to a power supply line, another power terminal of the second switch and the fourth switch is coupled to a first intermediate output terminal of the preamplifier carrying one of the pair of the intermediate voltages, and another power terminal the first switch and the third switch is coupled to a second intermediate output terminal of the preamplifier carrying the other one of the pair of the intermediate voltages, and
   wherein, the first intermediate output terminal is coupled to the control terminal of the first switch, the second intermediate output terminal is coupled to the control terminal of the fourth switch, and the control terminals of the second switch and the third switch receive the clock signal.

7. The AFE of claim 6, wherein the preamplifier further comprises a differential discharge circuit coupled to the voltage sampling circuit at the input terminals of the preamplifier and coupled to the first reset and amplifier circuit at the first intermediate output terminal and the second intermediate output terminal, wherein the differential discharge circuit is to:
   receive the sampled differential voltage signals from the voltage sampling circuit when the clock signal is at the first state; and
   enable discharge of the pair of the intermediate voltages when the clock signal is at the second state.

8. The AFE of claim 7, wherein the differential discharge circuit comprises:
   a fifth switch coupled between the first intermediate output terminal and a common terminal;
   a sixth switch coupled between the second intermediate output terminal and the common terminal; and
   a common switch coupled between the common terminal and the ground terminal,
   wherein a first series circuit of the fifth switch and the common switch forms a discharge path for one of the pair of the intermediate voltages, and wherein a second series circuit of the sixth switch and the common switch forms a discharge path for the other one of the pair of the intermediate voltages.

9. The AFE of claim 3, wherein the voltage latch circuit comprises a second reset and amplifier circuit to:
   receive the pair of the intermediate voltages;
   reset the pair of the digital voltages when the clock signal is at the first state; and cause one of the pair of the digital voltages to rise faster in comparison to the other one of the pair of the digital voltages based on magnitudes of the pair of the intermediate voltages when the clock signal is at the second state.

10. The AFE of claim 9, wherein the plurality of switches in the second reset and amplifier circuit comprises:
a first pair of parallel switches coupled between the power supply line and a first digital voltage output terminal of the voltage latch circuit; and
a second pair of parallel switches coupled between the power supply line and a second digital voltage output terminal of the voltage latch circuit,
wherein, one switch in each of the first pair of parallel switches and the second pair of parallel switches is controlled via respective ones of the pair of the intermediate voltages, and wherein the remaining switches of the first pair of parallel switches and the second pair of parallel switches are controlled via the clock signal.

11. The AFE of claim 9, wherein the voltage latch circuit further comprises a cross-coupled latch circuit coupled to the second reset and amplifier circuit to regenerate the pair of the digital voltages at the first digital voltage output terminal and the second digital voltage output terminal to either a ground-level voltage or a supply-level digital voltage.

12. A method comprising:
generating, by a trans-impedance amplifier, a pair of differential voltage signals using an input current and a reference current;
generating, by a preamplifier coupled to the trans-impedance amplifier, a pair of intermediate voltages based on the pair of the differential voltage signals sampled at a predetermined frequency;
regenerating, by a voltage latch circuit coupled to the preamplifier, a pair of digital voltages based on the pair of the intermediate voltages; and
generating, by a logic latch coupled to the voltage latch circuit, digital output states based on the pair of the digital voltages.

13. The method of claim 12, further comprising sampling, by a voltage sampling circuit coupled to the preamplifier, the pair of the differential voltage signals to generate sampled differential voltage signals when a clock signal is at a first state and supplying the sampled differential voltage signals to the preamplifier.

14. The method of claim 13, wherein generating the pair of the intermediate voltages comprises receiving the sampled differential voltage signals from the voltage sampling circuit when the clock signal is at the first state.

15. The method of claim 13, wherein generating the pair of the intermediate voltages comprises resetting the pair of the intermediate voltages to a predetermined voltage level when the clock signal is at the first state.

16. The method of claim 13, wherein generating the pair of the intermediate voltages comprises enabling discharge of the pair of the intermediate voltages when the clock signal is at the second state.

17. The method of claim 16, wherein generating the pair of the intermediate voltages further comprises causing, when the clock signal is at the second state, one of the pair of the intermediate voltages to drop faster via a respective discharge path of the discharge paths in comparison to the other one of the pair of the intermediate voltages depending on magnitudes of the sampled differential voltage signals received by the preamplifier.

18. The method of claim 13, further comprising receiving, by the voltage latch circuit, the pair of the intermediate voltages from the preamplifier.

19. The method of claim 13, wherein regenerating the pair of the digital voltages comprises reset the pair of the digital voltages when the clock signal is at the first state.

20. The method of claim 13, wherein regenerating the pair of the digital voltages comprises causing one of the pair of the digital voltages to rise faster in comparison to the other one of the pair of the digital voltages based on magnitudes of the pair of the intermediate voltages when the clock signal is at a second state.

* * * * *